US006765945B2

(12) United States Patent
Sandstrom et al.

(10) Patent No.: US 6,765,945 B2
(45) Date of Patent: Jul. 20, 2004

(54) INJECTION SEEDED F2 LASER WITH PRE-INJECTION FILTER

(75) Inventors: Richard L. Sandstrom, Encinitas, CA (US); William N. Partlo, Poway, CA (US); Eckehard D. Onkels, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 164 days.

(21) Appl. No.: 09/829,475

(22) Filed: Apr. 9, 2001

(65) Prior Publication Data

US 2002/0064202 A1 May 30, 2002

Related U.S. Application Data

(63) Continuation-in-part of application No. 09/473,795, filed on Dec. 28, 1999, now Pat. No. 6,381,257, and a continuation-in-part of application No. 09/459,165, filed on Dec. 10, 1999, now Pat. No. 6,370,174, and a continuation-in-part of application No. 09/438,249, filed on Nov. 12, 1999, now Pat. No. 6,330,260, and a continuation-in-part of application No. 09/421,701, filed on Oct. 20, 1999, now Pat. No. 6,359,922, and a continuation-in-part of application No. 09/407,120, filed on Sep. 27, 1999, now Pat. No. 6,240,110.

(51) Int. Cl.[7] .............................. H01S 3/22; H01S 3/223
(52) U.S. Cl. ............................ 372/57; 372/20; 372/32; 372/102; 372/25
(58) Field of Search ..................... 372/57–59, 31, 372/29.021, 32, 20, 29.011, 25, 102

(56) References Cited

U.S. PATENT DOCUMENTS

| 4,534,035 | A | | 8/1985 | Long ............................ 372/85 |
| 4,959,840 | A | | 9/1990 | Akins et al. .................. 372/57 |
| 5,070,513 | A | | 12/1991 | Letardi ......................... 372/83 |
| 5,192,980 | A | * | 3/1993 | Dixon et al. ................. 356/326 |
| 5,450,207 | A | * | 9/1995 | Fomenkov .................. 356/416 |
| 5,461,477 | A | * | 10/1995 | Marinelli et al. ........... 356/352 |
| 5,532,818 | A | * | 7/1996 | Tokumoto .................... 356/333 |
| 5,557,630 | A | * | 9/1996 | Scaggs ......................... 372/95 |
| 5,612,967 | A | * | 3/1997 | Lai .............................. 372/22 |
| 5,802,084 | A | * | 9/1998 | Bowers et al. ................ 372/18 |
| 5,856,991 | A | | 1/1999 | Ershov ......................... 372/57 |
| 5,978,394 | A | | 11/1999 | Newman et al. .............. 372/32 |
| 5,991,324 | A | | 11/1999 | Knowles et al. .............. 372/57 |
| 6,018,537 | A | | 1/2000 | Hofmann et al. ............. 372/25 |
| 6,128,323 | A | | 10/2000 | Myers et al. ................. 372/38 |
| 6,154,470 | A | | 11/2000 | Basting et al. ................ 372/19 |

OTHER PUBLICATIONS

Balla and Hart, "Spectral brightness and other improvements to the tunable ArF excimer laser," *Rev. Sci. Instum.*, vol. 59, No. 7, pp. 2591–2594 (Jul. 1998).

Bollanti et al., "Compact three electrodes excimer laser Ianus for a POPA optical system," *In: High–power gas and sol state lasers; Proceedings of the Meeting, Vienna, Austria, Apr. 5–8, 1994* (A95–2267605–36), Bellingham, WA, Society of Photo–Optical Instrumentation Engineers, SPIE Proceedings, vol. 2206, 1994, pp. 144–153.

(List continued on next page.)

*Primary Examiner*—Davienne Montbleau
(74) *Attorney, Agent, or Firm*—William Cray (57) ABSTRACT

A narrow band $F_2$ laser system useful for integrated circuit lithography. An output beam from a first $F_2$ laser gain medium is filtered with a pre-gain filter to produce a seed beam having a bandwidth of about 0.1 pm or less. The seed beam is amplified in a power gain stage which includes a second $F_2$ laser gain medium. The output beam of the system is a pulsed laser beam with a full width half maximum band width of about 0.1 pm or less with pulse energy in excess of about 5 mJ. In a preferred embodiment the pre-gain filter includes a wavelength monitor which permits feedback control over the centerline wavelength so that the pre-gain filter optics can be adjusted to ensure that the desired bandwidth range is injected into the power gain stage.

68 Claims, 9 Drawing Sheets

OTHER PUBLICATIONS

Bollanti et al., "Ianus, the three–electrode excimer laser," *Applied Physics B (Lasers and Optics)*, vol. B66, No. 4, pp. 401–406, Publisher: Springer–Verlag (*Apr.* 1998).

Hercher, Michael, "Tunable Single Mode Operation of Gas Lasers Using Intracavity Tilted Etalons," *Applied Optics*, vol. 8, No. 6, Jun. 1969, pp. 1103–1106.

Jenkins, Francis A. and White, Harvey E., "Fundamentals of Optics," McGraw–Hill Book Company, Fourth Edition, Copyright 1957, 1976, pp. 297–299.

Kakehata et al., "Gain and saturation intensity measurements of a discharge pumped $F_2$ laser at high excitation rates," *Appl. Phys. Letter*, 61(26), Dec. 28, 1992.

Kakehata et al., "Output characteristics of a discharge–pumped $F_2$ laser (167 nm) with an injection–seeded unstable resonator," *J. Appl. Phys.* 74(4), Aug. 15, 1993.

Mueckenhelm et al., "Excimer laser with narrow linewidth and large internal beam divergence," *Journal of Physics E–Scientific Instruments* (ISSN 0022–3735), vol. 20, Nov. 1987, pp. 1394–1396 (Nov. 1987).

Reintjes, John F., "Lser Handbook," *Elsevier Science Publishers, B.V.,* 1985, pp. 44–50.

* cited by examiner

INJECTION SEEDED F2 LASER WITH PRE-INJECTION FILTER

This Application is a Continuation-In-Part of Ser. No. 09/473,795 filed Dec. 28, 1999, now U.S. Pat. No. 6,381, 257, "Very Narrow Band Injection Seeded F2 Lithography Laser", Ser. No. 09/459,165 filed Dec. 10, 1999, now U.S. Pat. No. 6,370,174, "Injection Seeded $F_2$ Lithography Laser"; Ser. No. 09/438,249 filed Nov. 12, 1999, now U.S. Pat. No. 6,330,260, "$F_2$ Laser with Visible and IR Control"; Ser. No. 09/421,701, filed Oct. 20, 1999, now U.S. Pat. No. 6,359,922, "Single Chamber Gas Discharge Laser with Line Narrowed Seed Beam", and Ser. No. 09/407,120 filed Sep. 27, 1999, now U.S. Pat. No. 6,240,110, "Line Narrowed Laser with Etalon Output Coupler". This invention relates to lasers and in particular to injection seeded lasers used for integrated circuit lithography.

BACKGROUND OF THE INVENTION

Prior Art Lithography Lasers

KrF excimer lasers are the state of the art light source for integrated circuit lithography. One such laser is described in U.S. Pat. No. 4,959,840 issued Sep. 25, 1990. The lasers operate at wavelengths of about 248 nm. With the KrF laser integrated circuits with dimensions as small as 180 nm can be produced. Finer dimensions can be provided with ArF lasers which operate at about 193 nm or $F_2$ lasers which operate at about 157 nm. These lasers, the KrF laser, the ArF laser and the $F_2$ lasers, are very similar, in fact the same basic equipment used to make a KrF laser can be used to produce an ArF laser or an $F_2$ laser merely by changing the gas concentration, increasing the discharge voltage and modifying the controls and instrumentation to accommodate the slightly different wavelength.

Figure 1:
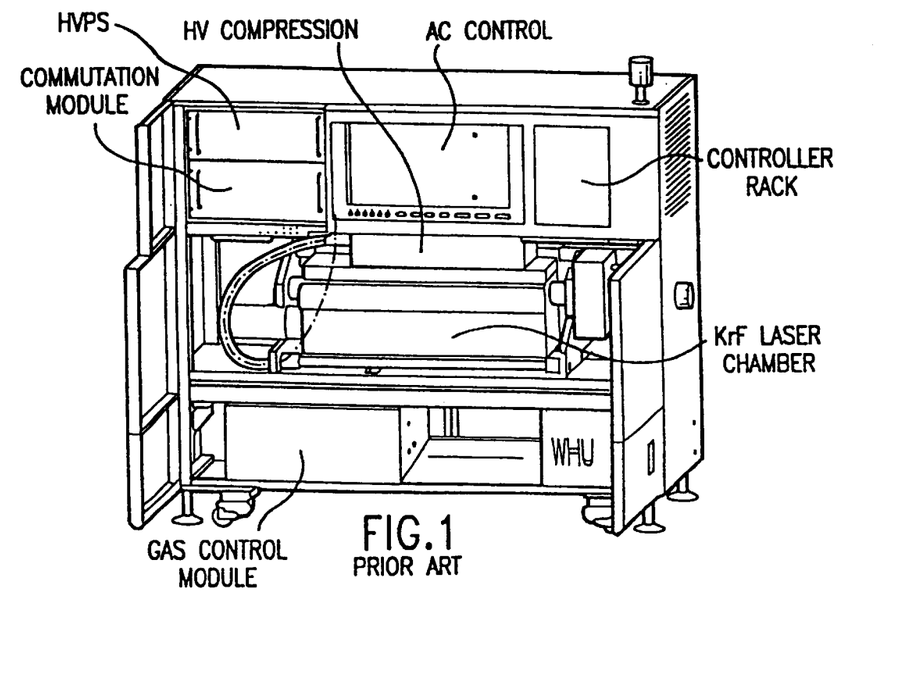
FIG. 1 is a drawing of a prior art commercial excimer lithography laser.
Figure 2:
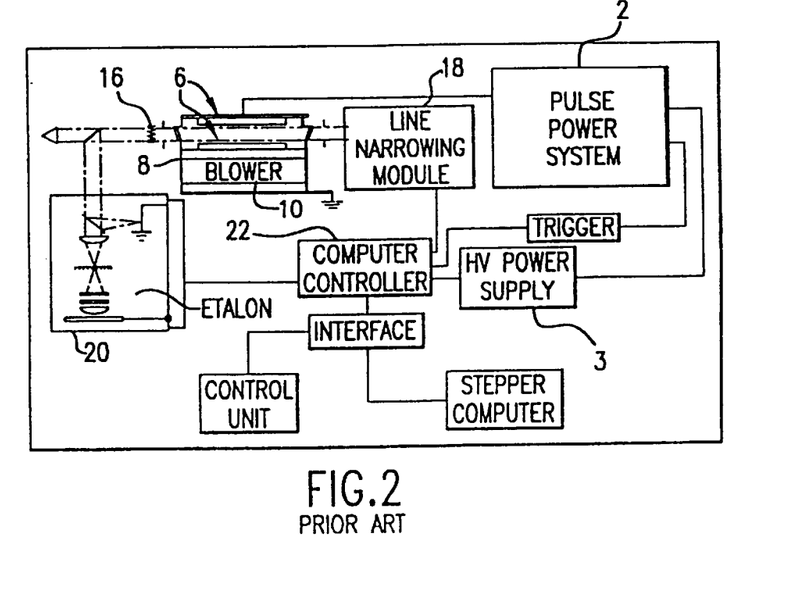
FIG. 2 is a block diagram showing some of the principal elements of a prior art commercial excimer lasers used for integrated circuit lithography.
Figure 3:
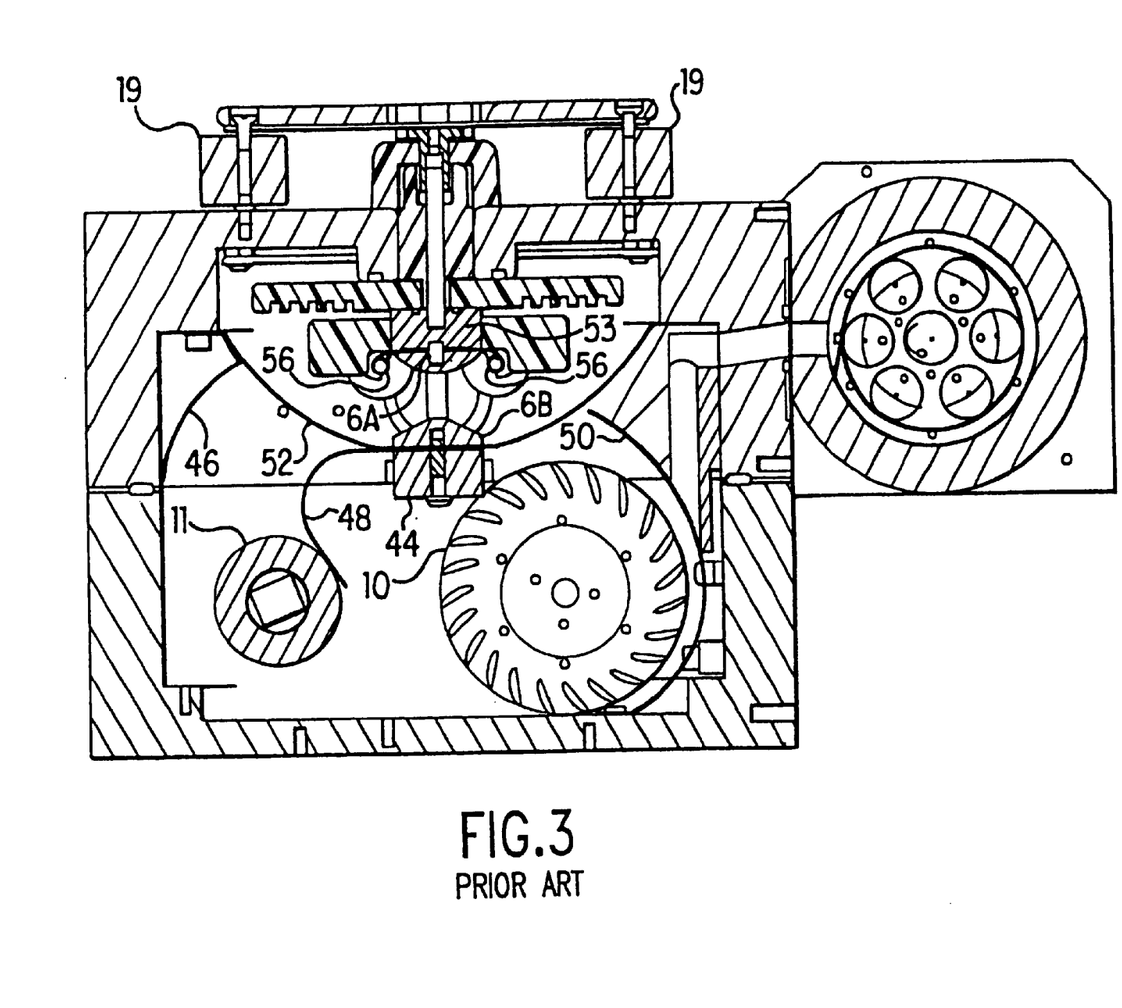
FIG. 3 is a drawing of the laser chamber of the FIG. 2 laser.

A typical prior-art KrF excimer laser used in the production of integrated circuits is depicted in FIGS. 1, 2 and 3. A cross section of the laser chamber of this prior art laser is shown in FIG. 3. As shown in FIG. 2, pulse power system 2 powered by high voltage power supply 3 provides electrical pulses to electrodes 6 located in a discharge chamber 8. Typical state-of-the art lithography lasers are operated at a pulse rate of about 1000 to 2000 Hz with pulse energies of about 10 mJ per pulse. The laser gas (for a KrF laser, about 0.1% fluorine, 1.3% krypton and the rest neon which functions as a buffer gas) at about 3 atmospheres is circulated through the space between the electrodes at velocities of about 1,000 to 2,000 cm per second. This is done with tangential blower 10 located in the laser discharge chamber. The laser gases are cooled with a heat exchanger 11 also located in the chamber and a cold plate (not shown) mounted on the outside of the chamber. The natural bandwidth of the excimer lasers is narrowed by line narrowing module 18 (sometimes referred to as a line narrowing package or LNP). Commercial excimer laser systems are typically comprised of several modules that may be replaced quickly without disturbing the rest of the system. Principal modules include:

Laser Chamber Module,
High voltage power supply module,
High voltage compression head module,
Commutator module,
Output Coupler Module,
Line Narrowing Module,
Wavemeter Module,
Computer Control Module,
Gas Control Module,
Cooling Water Module Electrodes 6 consist of cathode 6A and anode 6B. Anode 6B is supported in this prior art embodiment by anode support bar 44 which is shown in cross section in FIG. 3. Flow is counter-clockwise in this view. One corner and one edge of anode support bar 44 serves as a guide vane to force air from blower 10 to flow between electrodes 6A and 6B. Other guide vanes in this prior art laser are shown at 46, 48 and 50. Perforated current return plate 52 helps ground anode 6B to the metal structure of chamber 8. The plate is perforated with large holes (not shown in FIG. 3) located in the laser gas flow path so that the current return plate does not substantially affect the gas flow. A peaking capacitor bank comprised of an array of individual capacitors 19 is charged prior to each pulse by pulse power system 2. During the voltage buildup on the peaking capacitor, one or two preionizers 56 weakly ionize the lasing gas between electrodes 6A and 6B and as the charge on capacitors 19 reaches about 16,000 volts, a discharge across the electrode is generated producing the excimer laser pulse. Following each pulse, the gas flow between the electrodes of about 1 to 2 cm per millisecond, created by blower 10, is sufficient to provide fresh laser gas between the electrodes in time for the next pulse occurring one millisecond later.

In a typical lithography excimer laser, a feedback control system measures the output laser energy of each pulse, determines the degree of deviation from a desired pulse energy, and then sends a signal to a controller to adjust the power supply voltage so that energy of the subsequent pulse is close to the desired energy. These excimer lasers are typically required to operate continuously 24 hours per day, 7 days per week for several months, with only short outages for scheduled maintenance.

Injection Seeding

A well-known technique for reducing the band-width of gas discharge laser systems (including excimer laser systems) involves the injection of a narrow band "seed" beam into a gain medium. In one such system, a laser called the "seed laser" or "master oscillator" is designed to provide a very narrow laser band beam and that laser beam is used as a seed beam in a second laser. If the second laser functions as a power amplifier, the system is typically referred to as a master oscillator, power amplifier (MOPA) system. If the second laser itself has a resonance cavity, the system is usually referred to as an injection seeded oscillator (ISO) and the seed laser is usually called the master oscillator and the downstream laser is usually called the power oscillator.

$F_2$ Lasers Bandwidth

A typical KrF laser has a natural bandwidth of about 300 pm (FWHM) centered at about 248 nm and for lithography use, it is typically line narrowed to about 0.6 pm. ArF lasers have a natural bandwidth of about 500 centered at about 193 nm and is typically line narrowed to about 0.5 pm. These lasers can be relatively easily tuned over a large portion of their natural bandwidth using the line narrowing module 18 shown in FIG. 2. $F_2$ lasers typically produce laser beams with most of its energy in two narrow lines centered at about 157.63 nm and 157.52 nm. Often, the less intense of these two lines (i.e., the 157.52 nm line) is suppressed and the laser is forced to operate at the 157.63 nm line. The natural bandwidth of the 157.63 nm line is pressure dependant and varies from about 0.6 to 1.2 pm. An $F_2$ laser with a bandwidth in this range can be used with lithography devices utilizing a catadiophic lens design utilizing both refractive and reflective optical elements, but for an all-refractive lens design the laser beam should have a bandwidth of about 0.1 pm to produce desired results.

Optical Filters

There are many optical filters for selecting out narrow ranges of light in a beam. One such filter is a monochromator in which light passing through a first slit is collimated with a lens, dispersed spectrally with a dispersing element such as a prism or grating and the dispensed light is then focused to a focal plane with a selected spectral range collected through a slit located at the local plane.

What is needed is an improved narrow band $F_2$ laser system.

SUMMARY OF THE INVENTION

The present invention provides a narrow band $F_2$ laser system useful for integrated circuit lithography. An output beam from a first $F_2$ laser gain medium is filtered with a pre-gain filter to produce a seed beam having a bandwidth of about 0.1 pm or less. The seed beam is amplified in a power gain stage which includes a second $F_2$ laser gain medium. The output beam of the system is a pulsed laser beam with a full width half maximum band width of about 0.1 pm or less with pulse energy in excess of about 5 mJ. In a preferred embodiment the pre-gain filter includes a wavelength monitor which permits feedback control over the centerline wavelength so that the pre-gain filter optics can be adjusted to ensure that the desired bandwidth range is injected into the power gain stage.

The present invention provides a major system-level advantage over attempting to line-narrow the master oscillator in a conventional way. In conventional line-narrowing, the dispersive optics (etalons, gratings, etc.) are inserted into the optical resonator of the first laser. As a result, if the wavelength that the line-narrowing optics are selecting is incorrect, the master oscillator will not even lase. For the F2 laser, with approximately a 1 pm wide gain, the line narrowing optics must be tuned to within ±0.5 pm even before the laser is fired. This places an extremely difficult requirement on the stability of the line-narrowing optics, especially after long dormant periods with the laser off or in standby mode. In general, one cannot depend on the laser producing any significant light after long off periods. To accomodate this, one must resort to "blind search" methods to try to re-aquire lasing. In contrast, the free-running master oscillator of the present invention will always lase, even if the injection spectral filter is out of tune. This gives the opportunity to correct the tuning of the injection filter.

DETAILED DESCRIPTION OF PREFERRED EMBODIMENTS

Figure 4:
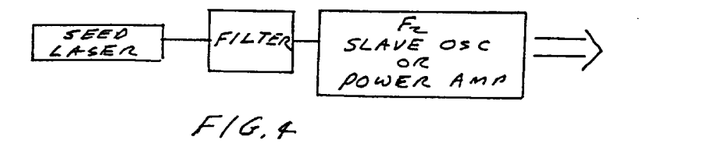
FIGS. 4 and 5 are block diagrams of $F_2$ laser systems.

Preferred embodiments of the present invention can be described by references to the drawings. A first preferred embodiment of the present invention is shown in block diagram form in FIG. 4 which was FIG. 6D in the "795 patent application. A pre-power gain filter is provided between the master oscillator (referred to as the seed laser) and the power gain stage (referred to there as the "slave oscillator power amp"). A second preferred embodiment is shown also in block diagram form in FIG. 5 which has a pre-gain filter and a second filter is provided downsteam of the power gain stage. Many variants are possible in each of the four principal elements of the FIG. 5 laser system and the post output filter may not be needed at all as shown in FIG. 4.

Terminology

Figure 5:
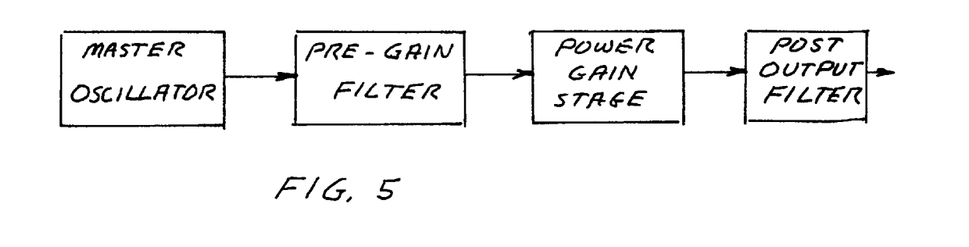

FIG. 5 shows the principal elements that make up several embodiments of very narrowband $F_2$ laser systems. Each of these elements can take several different forms and can be described in a variety of ways. In this specification we will use the phrase "first $F_2$ light source" to refer to any device which produces a beam of light with energy in the wavelength range at about 157.63 nm. If the first $F_2$ light source is an $F_2$ laser we may refer to it as a "master oscillator" or a "seed laser". The phrase "pre gain filter" will refer to any filter used to filter the output beam from the first $F_2$ light source to produce a filtered $F_2$ beam in the range of about 157.63 nm to a very narrow filtered $F_2$ beam in the range of 157.63 nm and having a band width of about 0.1 pm or less. The phrase "$F_2$ power gain stage" will refer to a gas discharge unit comprising an electric discharge chamber containing $F_2$ gas and a buffer gas and configured to amplify the very narrow filtered $F_2$ beam to produce an amplified $F_2$ laser beam. The phrase "post output $F_2$ filter" will refer to any spectral filter located downstream of the $F_2$ power gain stage and configured to spectrally filter the amplified pre-filtered $F_2$ beam.

First $F_2$ Light Source

A preferred first $F_2$ light source may be a conventional F2 laser, using either a plane-parallel optical resonator, or an unstable resonator configuration. It preferably will generate enough energy such that, after filtering, 10–100 $\mu$J of narrow-band energy is available for seeding the $F_2$ power gain stage. An unstable resonator will produce a lower divergence, more spatially coherent beam than a stable resonator, which may be of some advantage in coupling energy through the injection spectral filter. For instance, if the filter is a simple monochromator, a lower divergence beam will be more easily focused down to the input slit of the monochromator. Another design option is to operate the first $F_2$ light source laser at relatively low pressure ($\approx$100–200 kPa). This produces a substantially reduced spectral width: 0.3–0.6 pm. A lower spectral width means a greater fraction of the energy entering the post gain filter will make it through the filter. The raw output energy from the first $F_2$ light source will be much lower, but this may not be a practical disadvantage because the maximum energy that the injection filter can handle is similarly limited.

A conventional $F_2$ laser for use as the first $F_2$ light source is in a preferred embodiment a standard KrF lithography laser system modified for operation as a $F_2$ laser. These KrF lithography lasers are well known and there are more than 1,000 of these units operating today in integrated circuit fabrication plants as light sources for integrated circuit lithography machines. These lasers produce laser pulses at rates in the range of 1000 to 2000 pulses per second and are available from suppliers such as Cymer, Inc. with offices in San Diego, Calif. These lithography lasers are described in detail in many patents such as U.S. Pat. Nos. 5,991,324 and 6,128,323 both of which are incorporated herein by reference. The major modifications needed for operation as an $F_2$ laser are to change the gas mixture to about 0.1 percent fluorine and the remainder helium (although a neon or a combination of helium and neon could be used) and preferably the upper range of the discharge voltage is increased from about 26,000 volts to about 36,000 volts. A basic prototype $F_2$ laser system used for both the first $F_2$ light source and the power gain stage is described below in the section entitled "Prototype $F_2$ Lasers". That section describes all of the significant improvements to the prior art KrF laser system to produce an $F_2$ laser.

Pre-power Gain Filter

Figures 6, 6A:
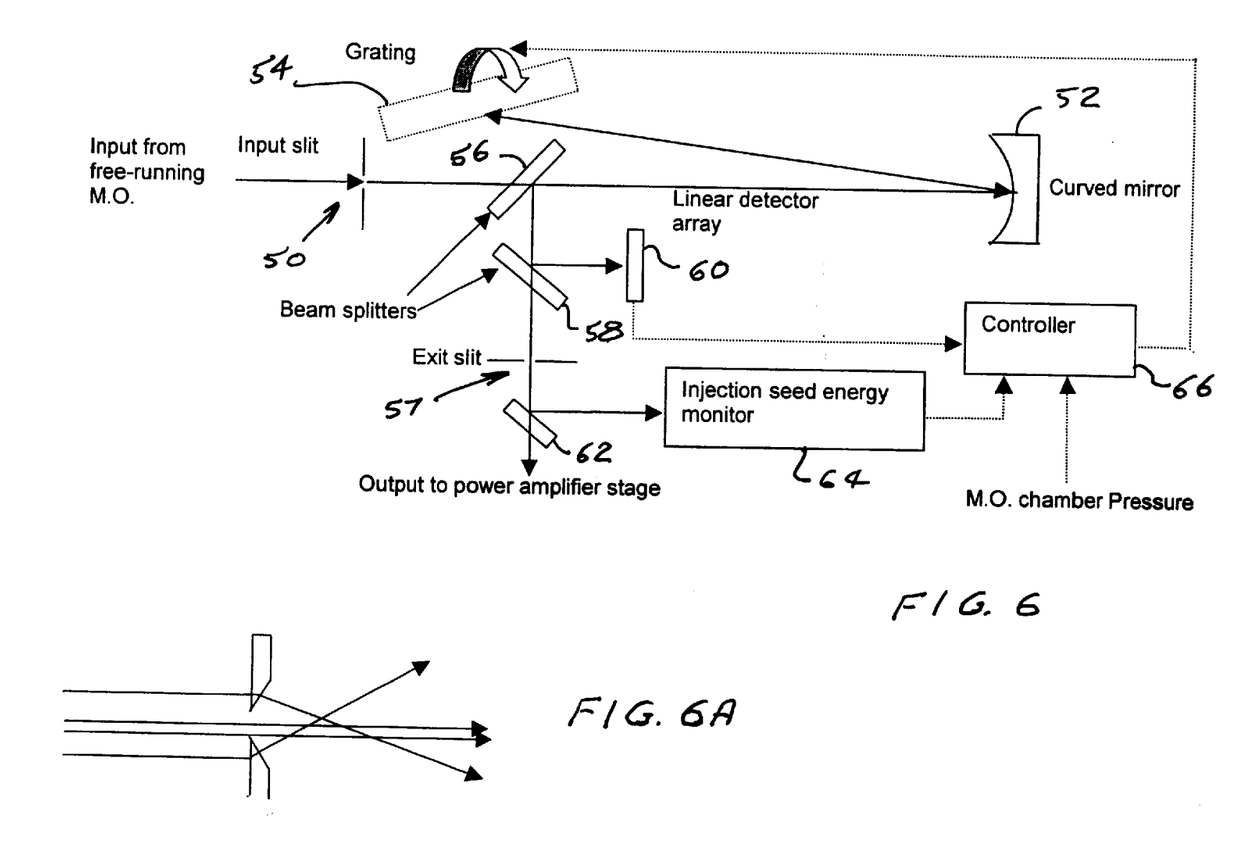
FIGS. 6 and 6A show features of a first grating monochromator.

A preferred conventional grating-monochromator pre-power gain filter is described by reference to FIG. 6. This filter, when used with a free-running $F_2$ laser as the master oscillator, preferably must slice out a 0.1 pm bandwidth portion of the free-running spectrum from the master oscillator, and be capable of producing the 10–100 µJ of narrow-band energy required by the following amplifier stage. This first filter embodiment shown in FIG. 6 is that of a conventional grating monochromator. Light from the master oscillator is first focussed down onto an input slit 50. Light passing though the input slit is collimated preferably by a curved mirror, which may be a simple spherical mirror, or an off-axis paraboloid, and the collimated light is directed to a grating 54. The grating is a high dispersion type (e.g. an echelle grating) chosen to disperse light in the 157 nm wavelength range. The grating is in the Lithrow configuration. Light at a selected very narrow range which is reflected back along the beam path 54 is re-imaged on an exit slit 57 with the aid of beam splitter 56. The various geometric and optical parameters of the arrangement (i.e. slit widths, grating dispersion, curved mirror focal length) determine the bandwidth of the light leaving the exit slit. One design problem that must be overcome is the high peak intensities that are reached at the input and exits slits when one attempts to couple the desired amount of energy through the monochromator. One method to handle these high intensities is to use refractive slits, i.e. knife edge wedges that refract the unwanted light into another direction, without absorbing the energy. Such a slit arrangement is shown in FIG. 6A.

In addition to its function as a filter, the arrangement of FIG. 6 includes an additional beamsplitter 58 and a linear detector array 60 placed at an exit image plane. This addition solves an important remaining problem: how to maintain the (tunable) injection filter at the desired wavelength. If the grating angle is in error by more than a few 10's of micro-radians, the seed beam will miss the exit slit, and there will be no narrow-band energy to lock the following power amplifier stage. If the angle is very slightly incorrect the amplified spectrum will not be at the desired wavelength. Fortunately, the monochromator can, in essence, monitor itself. The image formed by the grating and curved mirror is the dispersed spectrum of the light entering the monochromator. The second beam splitter produces two identical images (spectra), one at the exit slit, and one at the linear detector array. The linear detector array senses the relatively broad spectrum from the free-running master oscillator and converts it into a video signal representative of the spectral intensity at each point on the array. Since the free-running wavelength is stable and well-known, it serves as a calibration standard for the monochromator. A controller 66 reads out the linear detector array, and adjusts the grating angle so as to place the image of the spectrum centered at a desired point on the array, near the center for example. In this way the monochromator is self-stabilized to the free-running spectrum of the master oscillator. Since the exit slit and linear array are basically duplicate image planes, the exit slit position corresponds to a particular position, and hence wavelength, on the linear array. Therefor, with the free-running spectrum from the master oscillator as a spectral reference, the wavelength of the light leaving the exit slit can be precisely determined.

One method for calibrating this arrangement is to place a beamsplitter 62 in the path of the beam exiting the monochromator and to monitor the beam energy with energy detector 64. Such a detector is desirable in any event, since the energy of the injection seed needs to be monitored.

Calibration

A calibration sequence would proceed as follows: (1) With the grating at a starting angle, the laser is fired and the output energy from the exit slit is monitored, along with the spectral image falling on the linear array. The peak of the spectrum is determined in terms of the position, in pixels, on the array. (2) The grating angle is incremented and the measurements are repeated. (3) After the grating angle is scanned though a range, the resulting data is examined. The position of the spectrum on the array (in pixels) where the output energy maximizes corresponds to the equivalent position of the slit.

Once this calibrated position is determined, the known dispersion of the monochromator can be used to retune the grating to other wavelengths. For instance, suppose the monochromator dispersion is 0.1 pm/pixel, and further suppose the calibrated position of the exit slit is pixel 300. If the desired wavelength of the output is 157.6299 nm (157,629.9 pm), the center of the free-running spectrum, then the grating angle is adjusted so that the center of the image falls at pixel 300. If the desired wavelength is +0.2 pm away from the center (157.6301 nm), then the grating would be moved so that the center of the image would fall at pixel 302. A further refinement is to include the pressure of the master oscillator in the calibration and subsequent use of the monochromator, since the center of the free-running spectrum is pressure dependent. This pressure dependence must be included in the calibration, especially if the pressure of the master oscillator is allowed to vary significantly. We have determined that the center wavelength of the free-running laser has a pressure shift coefficient in the range of about 1 to 2 fm/kPa, when helium is used as a buffer. For any given pressure, a good estimate of the wavelength is therefor $157.6309 + 0.00000192*P$ nm, where P=pressure in kPa. Other pressure shift coefficients can be used if other buffer gasses are used (neon for instance, or mixtures of helium and neon).

Modified Grating Monochromator

Figure 7:
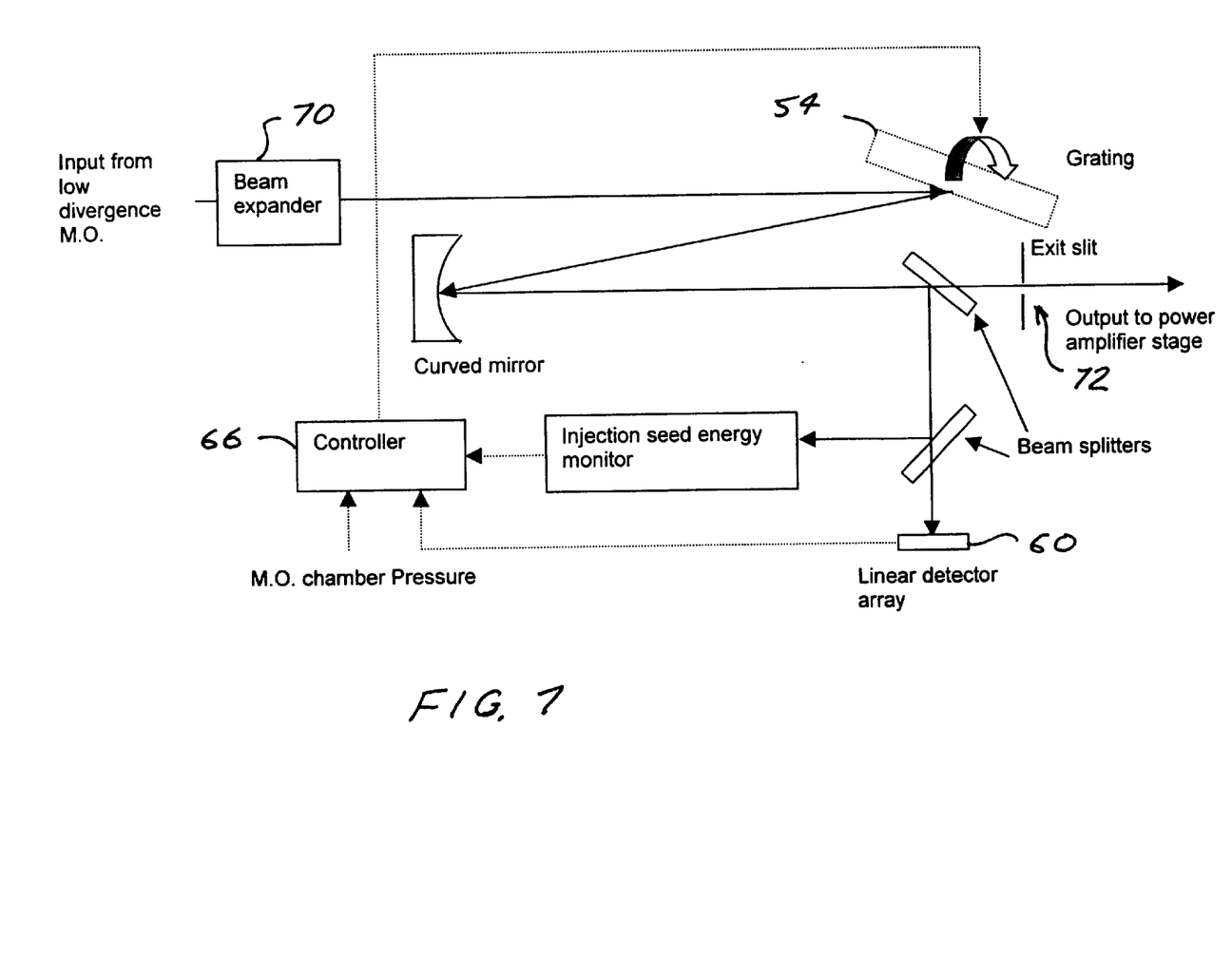
FIG. 7 shows features of a second grating monochromator.

An alternate method for producing the narrow-band light is with a modified grating monochromator as shown in FIG.

7. This filter filters the output beam of a master oscillator which produces a well-collimated, nearly diffraction limited coherent beam, and in this case we eliminate the entrance slit of the monochromator.

A beam expander 70 is used to reduce the divergence from the master oscillator and to physically match the size of the beam from the master oscillator to the grating 54. The dispersed light from the grating is focussed via a curved mirror (or lens) to an exit slit 72 where the desired wavelength is selected. The operation of the linear detector array 60 and controller 66 is the same as previously described. The advantage of this arrangement is that it eliminates the need for an entrance slit and the associated problems with high peak intensities. This arrangement has a disadvantage in that the pointing stability of the master oscillator is now a factor in the position of the image on the array, and hence the wavelength selection process. For slowly varying changes in the input angle from the master oscillator, the controller can retune the grating and keep the wavelength constant.

Etalon Filter

Figure 8:
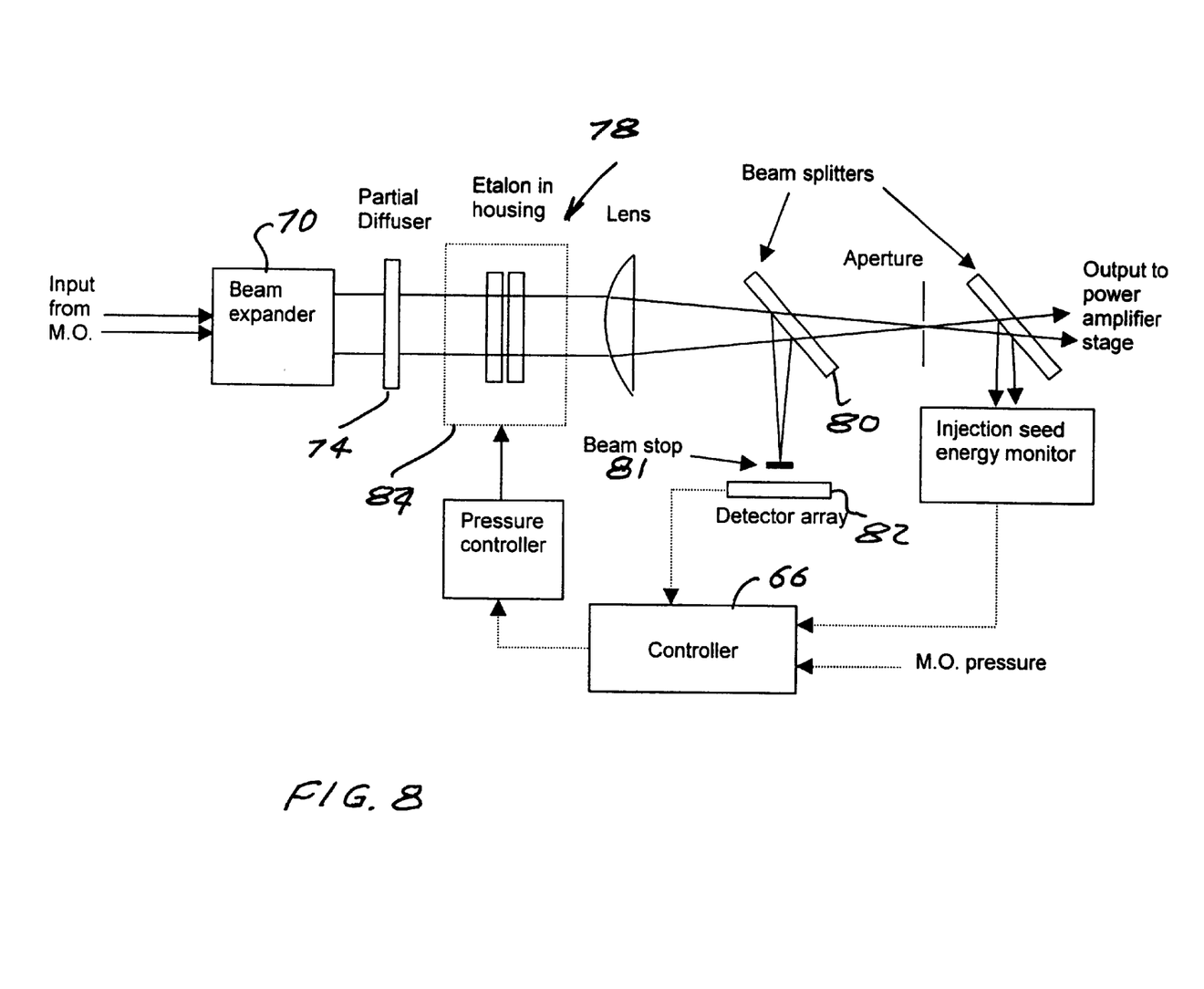
FIG. 8 shows features of an etalon filter.

An etalon 78 can also be used as a bandpass filter as shown in FIG. 8. As with the monochromator filters, it is desirable that the etalon be self-referenced to the free-running spectrum of the master oscillator, which is used as an atomic standard.

The beam from the master oscillator is first expanded with beam expander 70, both to lower its divergence and to reduce the power density on the etalon. After expansion, the beam passes through a special "partial diffuser" 74, an optical element which transmits most of the light unaltered, but scatters a small faction into a range of angles. Examples of this are diffractive optics with low diffraction strength, or very lightly and finely ground optical flats. The light then passes through the etalon at near normal incidence. The etalon's bandpass characteristics are determined by its free spectral range (FSR) and finesse. For instance, an etalon with an FSR of 2 pm and a finesse of 20 will have a bandpass of 0.1 pm FWHM. The etalon will then transmit a 0.1 pm slice of the spectrum from the free-running master oscillator. As with the monochromator, it may be advantageous to operate the master oscillator at low pressure, and hence reduced bandwidth, in order to limit the power loading on the etalon. In addition, a narrower starting spectrum will reduce the amount of energy in the adjacent transmission orders of the etalon (±1 FSR from the central wavelength). After passing through the etalon, a lens 76 (or curved mirror) focuses the light to a point, where an aperture is placed. A portion of the beam is split off by beam splitter 80 and monitored by a photodiode array 82 which provides center wavelength and bandwidth signals to controller 66 which uses this information to control the etalon 78. The purpose of the aperture is to block all light except the on-axis, non-diffused component of the beam. This light, which is narrow-band, is then sent on to the power amplifier stage. A beam splitter and optical detector follows the aperture, to monitor the energy leaving the injection filter.

In general, the central wavelength of the etalon's bandpass will not align with the center of the spectrum of the free-running master oscillator. The etalon needs to be tuned. Four methods are possible, depending on whether the etalon is a solid plate type or an air-spaced type. For solid etalons, the etalon can be tilted with respect to the incoming beam, or the temperature of the etalon can be varied, which effectively changes the optical thickness of the plate. For air-spaced etalons, the angle can be varied, the plate spacing can be varied (by PZT actuators, for instance), or the index of refraction of the gas between the plates can be varied by changing the density of the gas.

In a preferred embodiment, the etalon is an air-spaced type which is enclosed in a pressure-tight housing 84 as indicated in FIG. 8. A pressure controller is used to vary the pressure of the gas within the housing (at constant temperature), thereby pressure tuning the etalon. Since the amount of tuning required is very small (about ±0.2 to ±0.5 pm), the pressure change that is needed is also very small, about ±3 to ±8 torr with nitrogen as the gas. This can be achieved either by changing the volume of the (sealed) housing, or by actively introducing or withdrawing gas from a suitable supply. As the etalon is pressure tuned, the output intensity will alternately increase and extinguish as the bandpass wavelength sweeps through the spectrum from the free-running master oscillator.

Control over the tuning of the etalon is attained by including additional optical elements that turn the etalon into its own etalon spectrometer. An additional beamsplitter is located prior to the exit aperture, and forms a second focal plane of the lens. In this focal plane (as in the first), the intensity distribution consists of an intense spot at the center of focus plus a much weaker conventional etalon ring pattern. The intense spot is formed by the non-diffused portion of the beam passing through the etalon, whereas the etalon ring pattern is formed by the diffused portion of the beam. The intense central spot is not used here and is blocked with a beam stop 81. A linear detector array 82 is then placed in the focal plane to read out the etalon ring pattern. This arrangement is very similar to the design of current wavemeters used in lithographic lasers. For a given optical arrangement, there is a direct relationship between the diameters of the etalon rings and the central wavelength of the etalon bandpass.

Calibration of the arrangement is done in a manner similar to the procedure previously described for the monochromator filter. A calibration sequence would proceed as follows: (1) With the etalon pressure-tuned to a starting wavelength, the laser is fired and the output energy from the exit aperture is measured, along with the etalon ring pattern falling on the linear array. The diameter of the innermost, fully formed ring is determined. (2) The pressure controller increments the pressure in the etalon, and the measurements are repeated. (3) After the etalon is pressure-tuned through one free-spectral range, the resulting data is examined.

The diameter of the innermost ring where the output energy maximizes corresponds to the condition where the bandpass of the etalon is exactly tuned to the peak of the free-running spectrum from the master oscillator which is pressure dependent.

Once this calibrated diameter is determined, the wavelength of the etalon bandpass filter can be stabilized by varying the pressure in the etalon so as to maintain this diameter. As a further refinement, the etalon ring pattern can be converted directly into a "wavelength" by employing the same non-linear etalon equations used in the lithographic wavemeters. This allows the bandpass function to be detuned from the peak of the master oscillator spectrum by a known amount. A further refinement is to include the pressure of the master oscillator in the calibration and subsequent use of the etalon, as has been previously described.

Tuning

Normally the narrow spectral band (of about 0.1 pm or less) chosen for operation of the laser system will be the narrow band meeting desired bandwidth specifications with the maximum output pulse energy. However, a limited amount of wavelength tuning is possible with the pregain filters described above. Applicants expect that a tuning range of at least about 1.2 pm can fairly easily be achieved. Additional tuning is feasible with some significant compromise of output pulse energy. The tuning range is a function of laser gas pressure as indicated above.

Power Gain Stage

Two preferred power gain stages can be described by reference to FIGS. 9 and 10.

Power Oscillator

Figure 9:
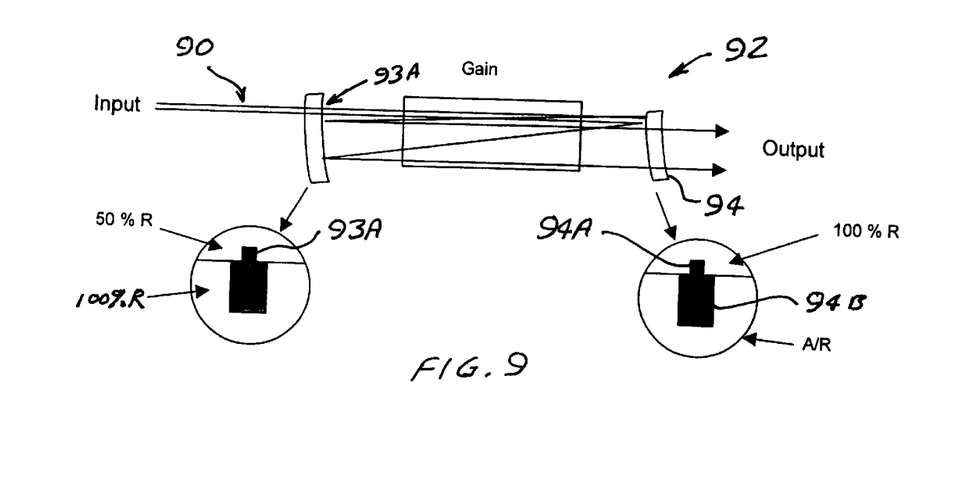
FIGS. 9 and 10 are diagrams of power gain stages.

The power gain stage can be configured either as a power oscillator as shown in FIG. 9. Many different resonators can be used for the PO design, depending on the desired output. In a preferred embodiment, the resonator is an off-axis hybrid unstable resonator, formed by two split-coated mirrors, all as shown in FIG. 9.

The injected seed beam 90 is aligned to a central axis along the top of an unstable resonator 92, and first travels through a 50% partial reflector 93A. The rear resonator optic 94 is a zero power meniscus type, which does not disturb the collimation of the injected beam. The injected beam fills the Fresnel core of the resonator, establishing control over the intercavity field (the Fresnel core in this case is the volume formed between 50% R mirror 93A and 100% R mirror 94A). After propagating with amplification to the front optic, the beam is reflected from the 100% reflective, convex surface. The beam expands and is amplified as it travels to the rear optic, where a portion reflects off of the 100% reflective, concave surface 93B and a portion reflects off surface 93A. This re-collimates the beam, which is further amplified by a third pass through the gain. The lower portion 94B of the output coupler is anti-reflective coated, allowing the beam to exit with minimal loss. As with the rear optic, the front optic is a zero-power meniscus type, to preserve the collimation of the output beam. This type of a resonator forms a power oscillator because the 50% and 100% reflective surfaces provide feedback into the Fresnel core of the resonator. The advantage of this type of resonator is (1) there is no central obscuration or hole in the beam, and (2) it requires very little seed energy to lock the power oscillator to the seed.

Power Amplifier

Figure 10:
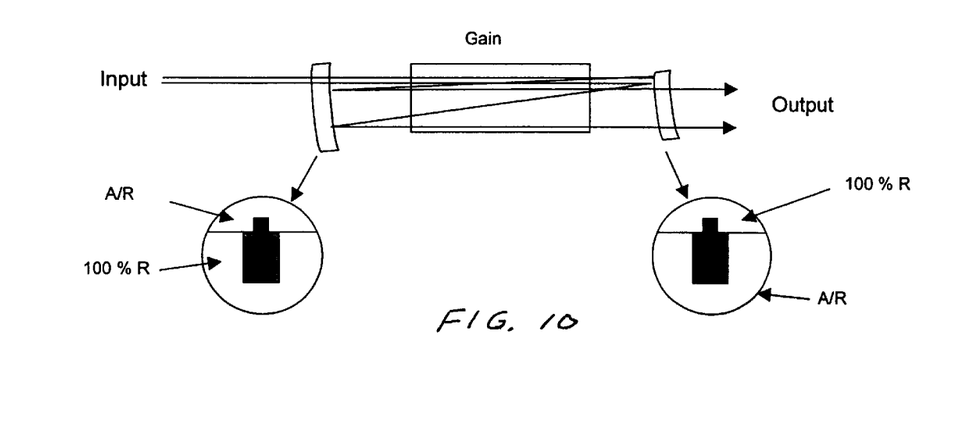

A power gain stage in the form of a power amplifier is shown in FIG. 10. In this case the resonator is similar to the one shown in FIG. 9 except the feedback has been eliminated by changing the 50% reflective surface 93A to an anti-reflective surface. This configuration produces an off-axis, multipass power amplifier.

$F_2$ Laser System Designs

Several prototype $F_2$ laser systems have been built and tested by Applicants and their fellow workers to serve as gain media for both as the first $F_2$ light source, and as the power gain stage.

These systems are largely based on current production KrF and ArF lasers incorporating several important improvements over prior art excimer laser systems, utilizing a high efficiency chamber and solid-state pulsed power excitation. The discharge is corona pre-ionized to minimize gas contamination. The entire optical beam path is nitrogen purged to avoid light absorption by oxygen and to avoid damage to optical components. All resonator optics were external to the angled chamber window equipped laser chamber. The gas mixture was 0.1% fluorine in 4 atmospheres of helium and the electrode gap was reduced to 10 mm.

Figure 11:
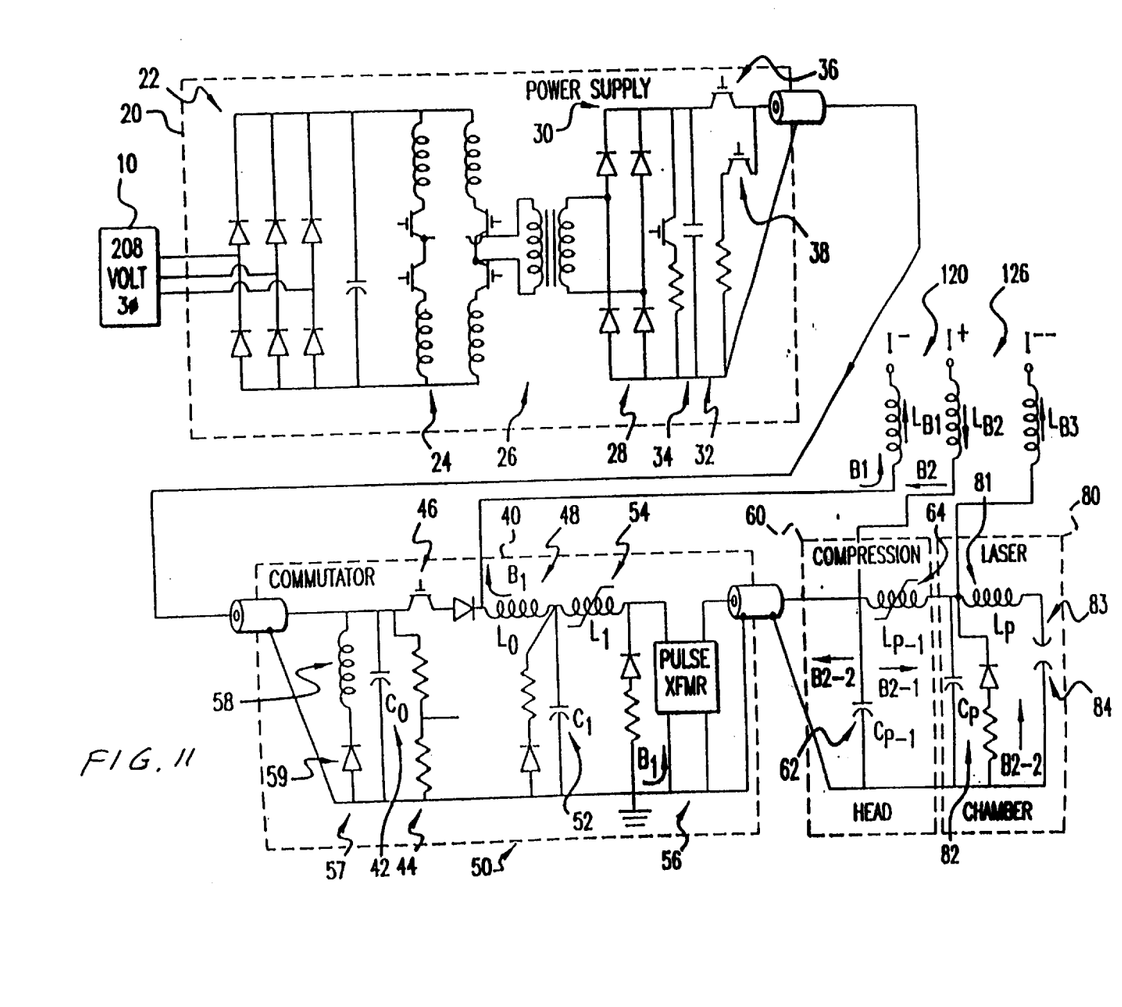
FIGS. 11, 11A, 11B, 11C and 11D show features of a pulse power system
Figures 11A, 11B, 11C:
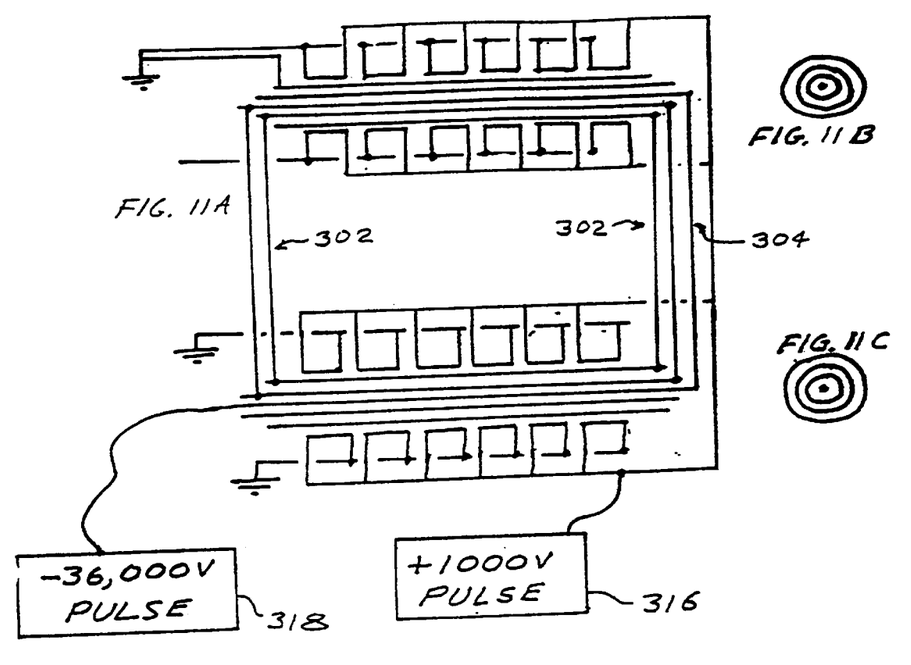
Figure 11D:
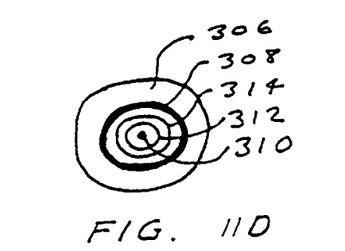

In these prototype units, for both the first $F_2$ light source and the power gain stage, a modified pulse power system is used and a circuit diagram for the system is shown in FIG. 11. The major difference between this system and the pulse power system for prior art KrF lasers is the pulse transformer 56. In this pulse transformer the single four-section stainless steel rod (described in U.S. Pat. No. 6,128,323 referred to above) which functions as a secondary winding is replaced by a transformer secondary conductor consisting of an inner cylindrical rod and two coaxial tubes all connected in series and insulated from each other as shown in FIGS. 11A, 11B and 11C. The secondary conductor consists of two coaxial assemblies (the cross-section of which are depicted in FIGS. 11B and 11C) connected with bus bar as shown at 302 and HV cable as shown at 304. FIG. 11D shows the same cross-sections as 11B and 11C and also the layers 306 of Metglas™ and mylar film which is wrapped around the cylinder portion 308 of the spools forming the primary winding. Also identified in FIG. 11D are the central wire 310 and hollow cylindrical conductors 312 and 314 forming the secondary portion of the pulse transformer. The Metglas™ and mylar layers are not shown in FIGS. 11A, 11B and 11C. A current pulse having a voltage peak of about 1,000 volts (as indicated at 316) will produce a pulse at the secondary HV terminal of about 0–36,000 volts as indicated at 318 in FIG. 11A.

Coupling between the primary cylinders and the three coaxial secondary conductors is provided by wrappings of Metglas™ and mylar film as described above with reference to FIG. 8E. In this embodiment an extra stage of compression (with one additional capacitor bank $C_{p-1}$) is provided. The capacitor banks in this embodiment have the following values:

$C_0$=about 12.1 $\mu$F $C_1$=about 12.4 $\mu$F $C_{p-2}$=about 8.82 nF $C_{p-1}$=about 8.4 nF $C_p$=about 10 nF The modified pulse power system in this prototype embodiment produces an output rise time of about 80 ns into the peaking capacitor bank. The step-up ratio of the pulse transformer is 36× (as compared to the 23× in the embodiment described in detail above). This permits the laser to operate at substantially higher voltages with correspondingly lower $F_2$ concentrations as compared to the unmodified pulse transforms. Applicant has determined that the higher voltage operation improves discharge stability, and permits higher repetition rates.

Post Output Filter

As indicated above, the output of power gain stage of preferred embodiments of the present invention will have ultraviolet bandwidths of about 0.1 pm or less with a line center within the nominal $F_2$ 157.63 nm line which covers a spectral range of about ±0.5 pm around the nominal wavelength. As indicated in the following section, a small amount of light energy in other spectral ranges are produced in $F_2$ lasers especially red and infrared light when helium is used. If this red light is a problem, it can be easily eliminated with well know optical filters designed to transmit 157 nm UV light and absorb or reflect away (not back into the laser) the red light. Also, a post output filter of one of the types described above could be added to further line narrow the output beam in the UV range. However, when used as a post output filter, the components of the filter need to be designed to handle a much higher energy beam.

Monitoring Pulse Energy
Prior Art Energy Detectors

With the prototype unit described above, prior art UV pulse energy detectors do not provide good results. This is because the $F_2$ laser produces a significant amount of light in the red and infrared spectral ranges. The pulse energy detectors used in prior art KrF and ArF lasers are very sensitive to light in the red and infrared spectral ranges. In fact these standard silicon photodiodes are much more sensitive to red and infrared than to laser light at 157 nm. Therefore, even when light is in the range of about 3% as indicated above, the effect on the silicon photodiode is much greater than 3%. For this reason, an energy detector should preferably be provided which is not significantly affected by visible red and infrared light. Detectors are available on the market which are especially sensitive to UV radiation and are relatively or completely insensitive to red and infrared radiation. These detectors generally are referred to as solar blind detectors and are use in above the atmosphere astronomical work but to the best of Applicants knowledge, they have not been applied to measure laser pulse energy. There are a number of methods available to construct a "solar blind" photodetector. Several strategies are discussed below.

Phototube

A phototube is a vacuum device consisting of two electrodes, a photocathode and an anode. Light striking the photocathode can cause the ejection of electrons from the cathode material via the photoelectric effect. The application of a positive voltage between the anode and cathode will drive the ejected electrons to the anode, generating a current through the device proportional to the number of photons/second striking the photocathode. This effect has a cutoff; irradiation with light of wavelength higher than a certain value does not produce photoelectrons. The maximum wavelength is defined by:

$$\lambda_{max} = hc/\Phi$$

where H is Planck's constant, c is the speed of light in vacuum, and $\Phi$ is a property of the material called the work function. Choice of a photocathode material with a sufficiently high work function (say, >4 electron volts) will result in the generation of photocurrent only for illumination at wavelengths shorter than 300 nm, i.e., solar-blind response. Examples of photocathode materials with acceptable work functions are CsTe, CsI and diamond films.

Photoconductor

Illumination of some semiconductors and/or insulating materials produces an effect closely related to the photoelectric effect: interaction between photons and electrons in the material excite electrons such that they are no longer bound to a specific site in the material (i.e., in the valence band), but are free to move through the crystal in response to an applied voltage (i.e, the conduction band). Again, a current is generated proportional to the flux of photons striking the material. This effect exhibits a wavelength cutoff identical to that given in the above equation, with the exception that the material work function, $\Phi$, is replaced by a different property usually called the band gap, $E_g$. Again, a material with sufficiently high band gap will respond only to short wavelength radiation. Diamond, with a 5.48 eV band gap, has a photoconductive response at wavelengths less than 200 nm.

Photodiode

Illumination of a diode junction (Schottky, p-n, or p-i-n doped semiconductor) can also promote electrons from the valence band to the conduction band, generating a photocurrent. The diode may be forward biased, in which case its performance is very similar to the photoconductor except that the charge carrier lifetime is longer. When reversed biased, the applied field improves the device response speed. Once more, a junction with sufficiently high band gap will allow response only at UV wavelengths.

Absorption Depth Grading

One way to greatly suppress the red response of a low-bandgap photoconductor or diode as compared to its UV response is by appropriate choice of the device thickness. It is characteristic of such materials that penetration of UV photons into the depth of the material is much less than that of visible light. That is to say, complete absorption of the UV light occurs in a much thinner layer near the surface. By choosing device thickness to be comparable to the absorption depth of the UV light (at some cutoff wavelength), one can make the device relatively transparent (and thus unresponsive) to longer wavelengths. While not truly solar-blind, such constructions can diminish the visible/IR response of the device below the threshold of detectability.

Preferred off-the-shelf solar-blind phototube detectors are available from suppliers such as Hamamatsu, Ltd. with offices in Los Angeles, Calif. and in Japan. Its Model R1187 using CsI has a spectral response in the range of 115 nm to 200 nm. Models R1107 and R763 use CsTe and have a best response range somewhat above 157 nm but could be used.

Figure 12:
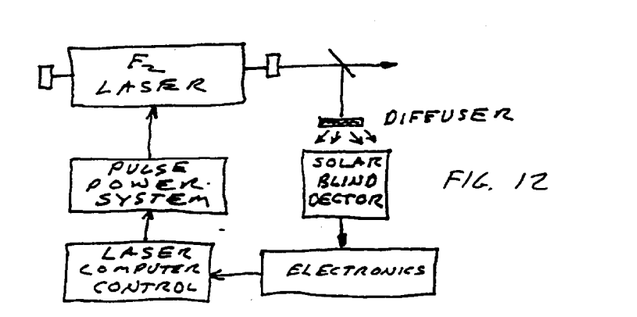
FIG. 12 shows a pulse energy detector in a feedback control system.

FIG. 12 shows a solar-blind detector being used in a laser system to keep the pulse energy and/or dose energy controlled to a desired level. (See prior section for details of controlling pulse and dose energy.)

Reflection Based Monitor

The sampled beam (Red and VUV) is reflected off several mirrors with dielectric coatings designed to produce high reflectivity at the (157 nm) VUV wavelength and low reflectivity in the red/infrared (the undesired wavelengths span a range from 635 nm to 755 nm). A typical optic might have 95% reflectivity at 157 nm and 4% reflectivity in the red/IR, giving an extinction ratio of ~24:1. The desired extinction ratio (typically 500 or 1000:1) may be obtained through successive incidences on several mirrors. The light transmitted through these mirrors should impinge on a red/IR-absorbing color glass filter, or other light trapping element, to prevent scattered light from finding its way to the detector.

Separation by Dispersion

A dispersive element (prism or grating) may be used to separate the VUV from the red/IR wavelengths, and the photodiode is placed to intercept only the VUV beam. With a grating element, the groove spacing must be chosen such that there is no substantial overlap between higher diffraction orders of the red/IR wavelengths and the UV wavelengths. That is, the grating equation must not be simultaneously satisfied at the design angle theta for the ultraviolet wavelengths and the visible/infrared wavelengths by varying the value of m (m is always an integer, e.g. D sin (theta)=$m_1$*157 nm≠$m_2$*755 nm (etc., for all visible/IR emission wavelengths).

Detection with Fluorescence

A material which, upon exposure to 157 nm light, fluoresces in the visible or infrared is placed in front of a silicon photodetector. By converting the VUV light to visible/IR light, the enhanced red response of the photodiode is counteracted. If the fluorescent emission wavelengths are substantially different from the red/IR laser emission wavelengths, one may employ a red/IR absorbing filter after the fluorescent converter to directly suppress the red/IR emission. The fluorescent converter might also be constructed or doped with such an absorber material.

Reducing the Red Radiation

Prior art $F_2$ lasers typically utilize helium as the buffer gas. It is known that neon can be used but the efficiency of the laser with the Ne buffer is greatly reduced as compared to the $F_2$ laser using He as a buffer. Generally, the use of Ne as a buffer requires substantially higher concentrations of $F_2$ and also higher voltage to produce equivalent laser pulse energy. Helium is much cheaper than neon, therefore, in the prior art He has been the natural choice for the $F_2$ buffer gas. However, as stated above the $F_2$ laser with the helium buffer produces a significant proportion of visible red and infrared light so that super fluorescence or even lasing occurs at the wavelengths. Normally the contribution is high enough so that lasing actually occurs at these longer wavelengths. These longer wavelengths in the laser beam can cause problems with regard to energy detection as discussed above and also the red wavelengths can cause problems in a downstream lithography system. These problems can be dealt with but a better solution in many cases is to substantially reduce or eliminate the red and infrared light from the beam as it is being created in the laser.

Applicants have described that the red and near-infrared light in the beam is in fact eliminated when the buffer gas is changed from pure helium to an appropriate mixture of helium and neon. However, in addition to substantially reducing the undesirable red and near-infrared components, the addition of Ne affects the efficiency of the laser at the desired UV wavelength. Therefore the best mixture of He and Ne may be different depending on the importance of maximum pulse energy and the relative importance of eliminating the red and near-infrared light. Normally, the preferred range of Ne as a percent of the total buffer quantity will be from about 40% to 95%. As indicated in FIG. 21, a good buffer gas mixture range providing substantially zero Red-IR but maximum UV pulse energy is between 0.52 and 0.63 neon and the rest helium.

Although the present invention has been described in terms of specific embodiments, the reader should understand that the scope of the invention is to be delimited by the appended claims and their legal equivalents.

We claim:

1. An $F_2$ laser system comprising:
   A) a first $F_2$ laser light source for producing a first pulsed output laser beam defining a pre-filter bandwidth substantially larger than 0.1 pm;
   B) a pre-power gain optical filter positioned to receive said first pulse output laser beam said pre-gain optical filter narrowing said pre-filter bandwidth and producing a filtered beam having a post filtered bandwidth of 0.1 pm or less; and
   C) a power gain laser positioned to receive said filtered beam and amplify it to produce an amplified pulse laser beam with pulses having energies greater than 3 mJ and defining a narrowed output bandwidth.

2. A laser system as in claim 1 and further comprising a post output filter positioned to receive said amplified pulse laser beam, further narrowing said narrowed output bandwidth.

3. A laser system as in claim 2 wherein said post output filter is a red light and infrared light filter for filtering red light and infrared light produced in said laser system.

4. A laser system as in claim 2 wherein said post output filter comprises a monochromator.

5. A laser system as in claim 2 wherein said post output filter comprises an etalon.

6. A laser system as in claim 1 wherein said first $F_2$ laser light source is an $F_2$ laser having a plane parallel optical resonator.

7. A laser system as in claim 1 wherein said first $F_2$ laser light source is an $F_2$ laser having an unstable resonator.

8. A laser system as in claim 7 wherein said first $F_2$ laser light source comprises a pulse power means for providing sufficient electrical pulse power to produce an output in the range of 10–100 µJ.

9. A laser system as in claim 1 wherein said pre-gain filter comprise monochromator.

10. A laser system as in claim 1 wherein said monochromater comprises a processor controller and a feedback loop for controlling wavelength of said first filtered beam.

11. A laser system as in claim 9 wherein said monochromator is a grating monochromator.

12. A laser system as in claim 11 wherein said monochromator comprises a slit configured to avoid thermal distortion.

13. A laser system as in claim 12 wherein said slit is a refractive slit.

14. A laser system as in claim 11 wherein said pre-gain filter comprises a wavelength monitor.

15. A laser system as in claim 14 wherein said wavelength monitor comprises a beam splitter and a linear detector array.

16. A laser system as in claim 15 wherein said wavelength monitor also comprises an injection seed pulse energy monitor.

17. A laser system as in claim 1 wherein said monochromator comprises a beam expander means for reducing divergence of said first pulse output laser beam to produce a low divergent beam which illuminates said grating.

18. A laser system as in claim 17 wherein said monochromator also comprises an exit slit and a focusing optic focusing light reflected from said grating onto said exit slit.

19. A laser system as in claim 17 wherein said monochromator also comprises a wavelength monitor.

20. A laser system as in claim 19, wherein said wavelength monitor comprises a beam splitter and a linear detector array.

21. A laser system as in claim 11 wherein said grating monochromator comprises a grating positioned in a Lithgow configuration.

22. A laser system as in claim 1 wherein said pre-gain filter comprises a processor controller and a feedback loop for controlling wavelength of said first filtered beam.

23. A laser system as in claim 1 wherein said power gain laser is a power oscillator.

24. A laser system as in claim 23 wherein said laser comprises a resonator defining a fresnel core and said laser also comprises a high reflection convex mirror and a high reflection concave mirror.

25. A laser system as in claim 1 wherein said amplifier is a power amplifier.

26. A laser system as in claim 25, wherein said power amplifier is an off-axis power amplifier.

27. A laser system as in claim 1 wherein said pre-gain filter is an etalon filter.

28. A laser system as in claim 27 wherein said etalon filter comprises a beam expander and a partial diffuser.

29. A process for producing a narrow-band pulsed ultraviolet laser beam comprising the steps of:

A) producing in a first $F_2$ laser a first pulse output laser beam defining a pre-filter bandwidth substantially larger than 0.1 pm;

B) filtering said first pulse output laser beam in a pre-power gain optical filter positioned to receive said first pulse output laser beam said pre-gain optical filter filtering said pre-filter bandwidth to produce a filtered beam having a post filtered bandwidth of 0.1 pm or less; and C) amplifying said filtered beam in a power gain laser to produce an amplified pulse laser beam with pulses having energies greater than 3 mJ and defining a narrowed output bandwidth.

30. A process as in claim 29 and further comprising a step of further narrowing said narrowed output bandwidth with a post output filter.

31. A process as in claim 29 wherein said first $F_2$ laser comprises a plane parallel optical resonator.

32. A process as in claim 29 wherein said first F laser is an $F_2$ laser having an unstable resonator.

33. An $F_2$ laser system comprising:

a first $F_2$ laser light source producing a first pulse output laser beam defining a pre-filter beam spectrum defining a most intense $F_2$ spectral line defining a center line and a plurality of additional spectral lines including a plurality of spectral lines within ±30 pm of the center line of the most intense $F_2$ spectral line;

a pre-power gain optical filter positioned to receive said first pulse output laser beam said pre-gain optical filter filtering from said first pulse output beam light a portion or all of said additional spectral lines which are farther away from said center line than a selected distance in order to produce a beam with a filtered bandwidth generally corresponding to the natural bandwidth of said most intense $F_2$ line; and a power gain laser positioned to receive said filtered beam and amplify it to produce an amplified pulse laser beam with pulses having energies greater than 3 mJ and defining a narrowed output bandwidth of 0.1 pm or less.

34. A laser system as in claim 33 and further comprising a post output filter positioned to receive said amplified pulse laser beam, said post output filter being configured to further narrow said narrowed output bandwidth.

35. A laser system as in claim 34 wherein said post output filter is configured to discriminate against red light and infrared light produced in said laser system.

36. A laser system as in claim 34 wherein said post output filter comprises a monochromator.

37. A laser system as in claim 34 wherein said post output filter comprises an etalon.

38. A laser system as in claim 33 wherein said first $F_2$ laser light source is an $F_2$ laser having a plane parallel optical resonator.

39. A laser system as in claim 33 wherein said first $F_2$ laser light source is an $F_2$ laser having an unstable resonator.

40. A laser system as in claim 39 wherein said first $F_2$ laser light source is configured to produce an output in the range of 10–100 µJ.

41. A laser system as in claim 33 wherein said pre-gain filter comprises a monochromator.

42. A laser system as in claim 41 wherein said monochromator is a grating-monochromator.

43. A laser system as in claim 42 wherein said grating monochromator comprises a grating positioned in a Lithrow configuration.

44. A laser system as in claim 41 wherein said monochromator comprises a beam expander configured to reduce divergence of said first pulse output laser beam to produce a low divergent beam which illuminates said grating.

45. A laser system as in claim 44 wherein said monochromator also comprises an exit slit and a focusing optic for focusing light reflected from said grating onto said exit slit.

46. A laser system as in claim 41 wherein said monochromator also comprises a wavelength monitor.

47. A laser system as in claim 46 wherein said wavelength monitor comprises a beam splitter and a linear detector array.

48. A laser system as in claim 41 wherein said monocrometer comprises a processor controller and a feedback loop for controlling wavelength of said first filtered beam.

49. A laser system as in claim 41 wherein said monochromator comprises a slit configured to avoid thermal distortion.

50. A laser system as in claim 49 wherein said slit is a refractive slit.

51. A laser system as in claim 33 wherein said pre-gain filter comprises a wavelength monitor.

52. A laser system as in claim 51 wherein said wavelength monitor comprises a beam splitter and a linear detector array.

53. A laser system as in claim 51 wherein said wavelength monitor also comprises an injection seed pulse energy monitor.

54. A laser system as in claim 33 wherein said pre-gain filter is an etalon filter.

55. A laser system as in claim 54 wherein said etalon filter comprises a beam expander and a partial diffuser.

56. A laser system as in claim 33 wherein said pre-gain filter comprises a processor controller and a feedback loop for controlling wavelength of said first filtered beam.

57. A laser system as in claim 33 wherein said power gain laser is configured as a power oscillator.

58. A laser system as in claim 33 wherein power gain laser comprises a resonator defining a fresnel core and said power gain laser also comprises a high reflection convex mirror and a high reflection concave mirror.

59. A laser system as in claim 33 wherein said power gain laser is configured as a power amplifier.

60. A laser system as in claim 59 wherein said power amplifier is an off-axis power amplifier.

61. A laser as in claim 33 wherein said selected distance is about 4.0 pm.

62. A laser as in claim 33 wherein said selected distance is about twice the FWHM bandwidth of the most intense $F_2$ line.

63. A laser as in claim 33 wherein said selected distance is about equal to the FWHM bandwidth of the most intense $F_2$ line.

64. A laser as in claim 33 wherein said selected distance is about four times the FWHM bandwidth of the most intense $F_2$ line.

65. A process for producing a narrow-band pulsed ultraviolet laser beam comprising the steps of:

A) utilizing a first $F_2$ laser light source configured to produce a first pulse output laser beam defining a pre-filter beam spectrum defining a most intense $F_2$ spectral line defining a center line and a plurality of additional spectral lines including a plurality of spectral lines within ±30 pm of the center line of the most intense F2 spectral line;

utilizing a pre-power gain optical filter positioned to receive said first pulse output laser beam to filter from said first pulse output beam light a portion or all of said additional spectral lines which are farther away from said center line than a selected distance in order to produce a beam with a filtered bandwidth generally corresponding to the natural bandwidth of said most intense F2 line; and utilizing a power gain laser to receive said filtered beam and amplify it to produce an amplified pulse laser beam with pulses having energies greater than 3 mJ and defining a narrowed output bandwidth of 0.1 pm or less.

66. A process as in claim 65 and further comprising a step of further narrowing said narrowed output bandwidth with a post output filter.

67. A process as in claim 65 wherein said first $F_2$ laser comprises a plane parallel optical resonator.

68. A laser system as in claim 65 wherein said first $F_2$ laser is an $F_2$ laser having an unstable resonator.

* * * * *